US010340333B2

(12) United States Patent
Herman

(10) Patent No.: US 10,340,333 B2
(45) Date of Patent: *Jul. 2, 2019

(54) III-NITRIDE POWER SEMICONDUCTOR DEVICE

(71) Applicant: Infineon Technologies Americas Corp., El Segundo, CA (US)

(72) Inventor: Thomas Herman, Manhattan Beach, CA (US)

(73) Assignee: Infineon Tecimologies Americas Corp., El Segundo, CA (US)

( * ) Notice: Subject to any disclaimer, the term of this patent is extended or adjusted under 35 U.S.C. 154(b) by 307 days.

This patent is subject to a terminal disclaimer.

(21) Appl. No.: 15/191,863

(22) Filed: Jun. 24, 2016

(65) Prior Publication Data

US 2016/0380046 A1 Dec. 29, 2016

Related U.S. Application Data

(63) Continuation of application No. 12/162,749, filed as application No. PCT/US2007/006903 on Mar. 20, 2007, now Pat. No. 9,391,185, and a continuation-in-part of application No. 11/725,430, filed on Mar. 19, 2007, now Pat. No. 7,408,208.

(60) Provisional application No. 60/784,054, filed on Mar. 20, 2006.

(51) Int. Cl.
| *H01L 29/06* | (2006.01) |
| *H01L 29/20* | (2006.01) |
| *H01L 29/778* | (2006.01) |
| *H01L 29/205* | (2006.01) |
| *H01L 29/47* | (2006.01) |

(52) U.S. Cl.
CPC ........ *H01L 29/063* (2013.01); *H01L 29/2003* (2013.01); *H01L 29/205* (2013.01); *H01L 29/475* (2013.01); *H01L 29/7787* (2013.01)

(58) Field of Classification Search
CPC ............. H01L 29/2003; H01L 29/7787; H01L 29/66462; H01L 2924/00; H01L 29/7786
See application file for complete search history.

(56) References Cited

U.S. PATENT DOCUMENTS

| 7,501,669 B2* | 3/2009 | Parikh | H01L 29/812 257/192 |
| 7,612,390 B2* | 11/2009 | Saxler | H01L 29/2003 257/194 |
| 2002/0017648 A1* | 2/2002 | Kasahara | H01L 21/28575 257/79 |

(Continued)

*Primary Examiner* — Tony Tran
(74) *Attorney, Agent, or Firm* — Murphy, Bilak & Homiller, PLLC

(57) ABSTRACT

A power semiconductor device includes a III-nitride heterojunction body including a first III-nitride body and a second III-nitride body having a different band gap than that of the first III-nitride body, a first power electrode coupled to the second III-nitride body, a second power electrode coupled to the second III-nitride body, a gate arrangement disposed between the first and second power electrodes, and a conductive channel that includes a two-dimensional electron gas that in a conductive state includes a reduced charge region under the gate arrangement that is less conductive than its adjacent regions. The reduced charge region extends beyond an edge of the gate arrangement toward one of the power electrodes only.

23 Claims, 5 Drawing Sheets

(56) References Cited

U.S. PATENT DOCUMENTS

2005/0189561 A1* 9/2005 Kinzer ................ H01L 27/0605
257/192

* cited by examiner

III-NITRIDE POWER SEMICONDUCTOR DEVICE

RELATED APPLICATION

This application relates to and claims priority from U.S. application Ser. No. 11/725,430, filed Mar. 19, 2007, entitled III-Nitride Power Semiconductor Device which is based on and claims priority to the of U.S. Provisional Application Ser. No. 60/784,054, filed on Mar. 20, 2006, entitled HEMT With Increased Breakdown Voltage and Reduced Electric Field Using Lightly Doped Channel Extensions, to which a claim of priority is hereby made and the disclosure of which is incorporated by reference.

DEFINITION

III-nitride (or III-N) as used herein refers to a semiconductor alloy from the InAlGaN system that includes at least nitrogen and another alloying element from group AlN, GaN, AlGaN, InGaN, InAlGaN, or any combination that includes nitrogen and at least one element from group III are examples of III-nitride alloys.

BACKGROUND OF THE INVENTION

Referring to FIG. 1, a conventional III-nitride power semiconductor device includes a III-nitride heterojunction body 10. III-nitride heterojunction body 10 includes first III-nitride semiconductor body 12 formed with one III-nitride semiconductor alloy (e.g. GaN) and second III-nitride semiconductor body 14 on body 12 formed with another III-nitride semiconductor alloy having a band gap different from that of first III-nitride semiconductor body 12 (e.g. AlGaN).

As is known, the composition and thickness of each III-nitride semiconductor body 12, 14 is selected to generate a two-dimensional electron gas 16 (2-DEG) at the heterojunction of the two bodies 12, 14.

2-DEG 16 to generated is rich in carriers and serves as a conductive channel between a first power electrode 18 (e.g. source electrode) which is ohmically coupled to second III-nitride body 14 and second power electrode 20 (e.g. drain electrode) which is also ohmically coupled to second III-nitride body 14. To control the state of conductivity between first power electrode 18 and second power electrode 20, a gate arrangement 22 is disposed between first 18 and second 20 power electrodes, which may reside on second III-nitride body 14. Gate arrangement 22, for example, may include a schottky body in schottky contact with second III-nitride body 14, or alternatively may include a gate insulation body and a gate electrode capacitively coupled to 2-DEG 16 through the gate insulation.

III-nitride heterojunction 10, in a conventional design, is disposed over a substrate 28. Typically, a transition body 30 is disposed between substrate 28 and heterojunction 10. A passivation body 32 through which electrodes 18, 20 are in contact with body 14 may be also provided to protect the active portion of heterojunction 10.

It has been observed that high electric field build-up near the gate arrangement results in gate breakdown (particularly at the edge closest to the drain electrode of the device). Other disadvantages include low drain-source breakdown voltage, and time dependent degradation of device parameters due to hot carriers and charge trapping. FIG. 3 illustrates schematically electric field lines 24 near the edges of gate arrangement 22 of a device according to FIG. 1.

Referring to FIG. 2, to improve the capability of a III-nitride device to withstand breakdown at the edges of its gate, a field plate 26 is provided that extends laterally from, for example, the gate electrode of the device over passivation body 32 toward a power electrode (e.g. drain electrode) of the device. The provision of field plate 26 reduces the strength of the electric field at the edge of gate arrangement 22 by spreading the field lines 27 as illustrated schematically in FIG. 4.

While field plate 26 can reduce the intensity of the electric field and improve the breakdown voltage of the device it is disadvantageous because:

1. it increases the active area of the device;
2. while it causes the movement of the point of high electric field to the edge of field plate 25, it may still allow changes to occur;
3. the increase gate-drain overlap capacitance degrades high frequency switching and increases switching losses, which is worsened by the Miller Effect.

SUMMARY OF THE INVENTION

In a device according to the present invention the peak electric field at the edges and corners of the gate are reduced by selectively reducing the mobile charge concentration in the conducting 2-DEG.

According to one aspect of the present invention the mobile charge concentration is reduced in a region that is disposed under the gate and extends laterally equal to or greater than the width of the gate, but the mobile charge concentration is otherwise held very high to keep the parasitic source-drain series resistance to a low value.

A power semiconductor device according to the present invention includes a first III-nitride body and a second III-nitride body having a different band gap than that of the first III-nitride body and disposed on the first III-nitride body to form a III-nitride heterojunction, a first power electrode coupled to the second III-nitride body, a second power electrode coupled to the second III-nitride body, a gate arrangement disposed between the first and the second power electrodes, and a conductive channel that includes a two-dimensional electron gas that in a conductive state includes a reduced charge region under the gate arrangement that is less conductive than its adjacent regions.

In one embodiment, an implanted region in the second III-nitride body under the gate arrangement is configured to cause the reduced charge region.

In another embodiment, the gate arrangement is received in a recess over the reduced charge region, which causes the reduced charge region.

Other features and advantages of the present invention will become apparent from the following description of the invention which refers to the accompanying drawings.

DETAILED DESCRIPTION OF THE EMBODIMENTS

Figure 1:
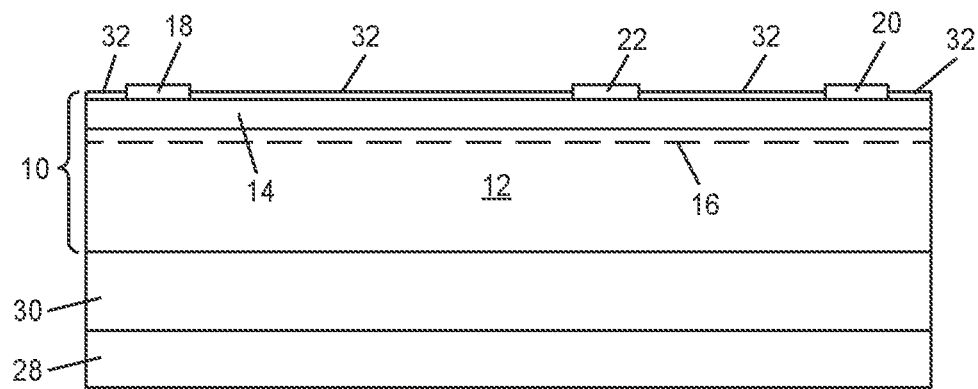
FIG. 1 illustrates a cross-sectional portion of the active region of a III-nitride device according to the prior art.
Figure 2:
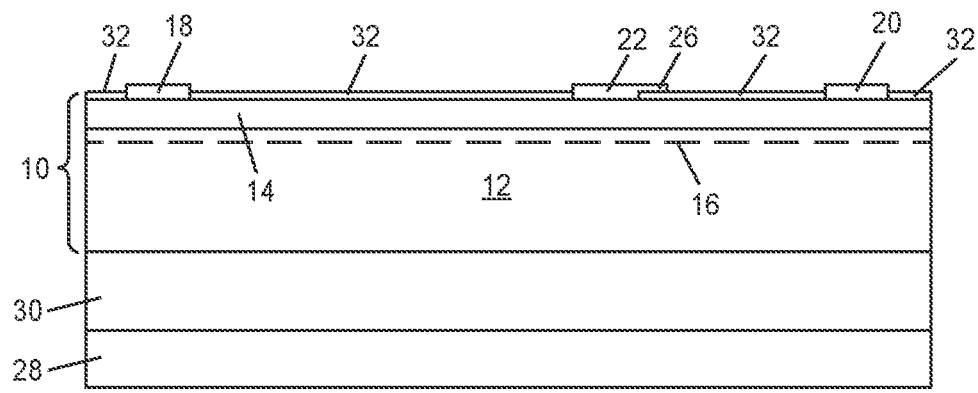
FIG. 2 illustrates a cross-sectional portion of the active region of another III-nitride device according to the prior art.
Figure 3:
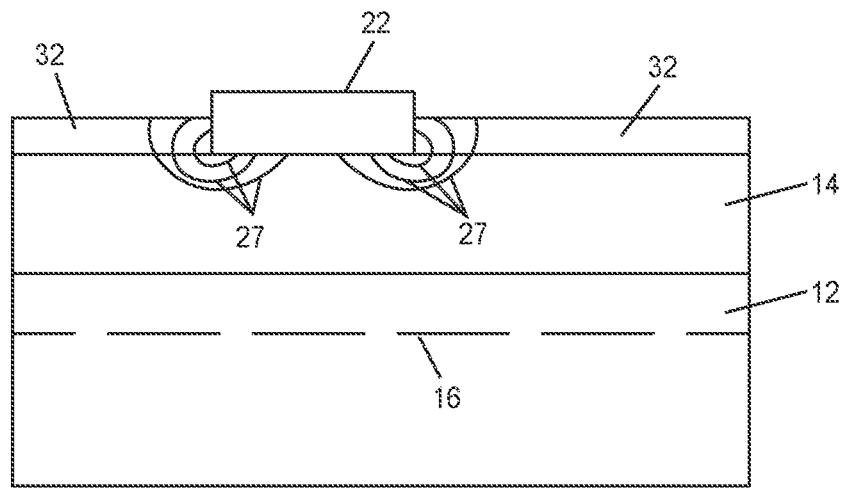
FIG. 3 illustrates schematically the electric field lines near the gate of a device according to FIG. 1.
Figure 4:
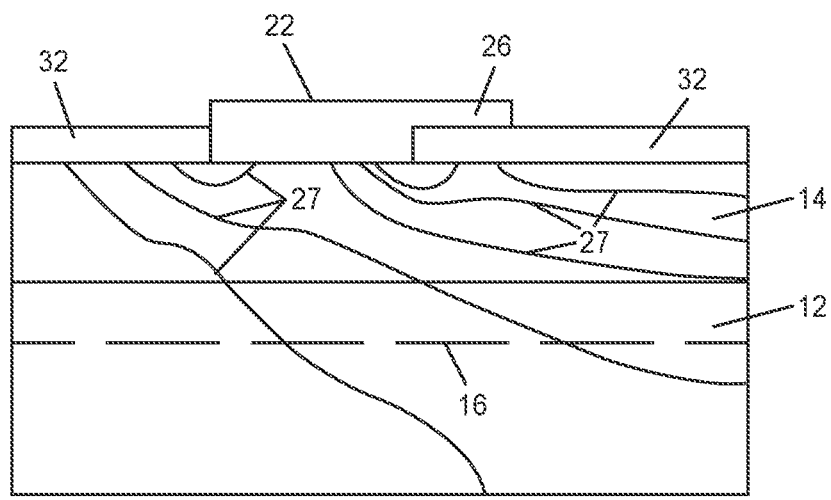
FIG. 4 illustrates schematically the electric field lines near the gate of the device according to FIG. 2.
Figure 5:
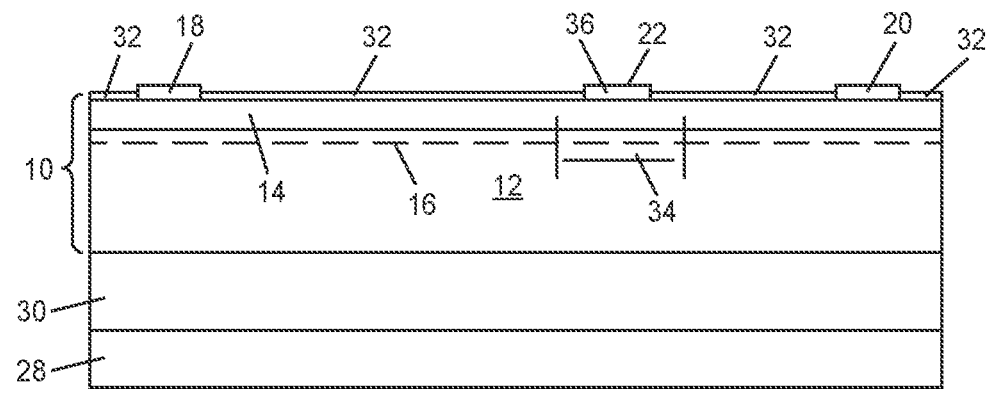
FIG. 5 illustrates a cross-sectional portion of the active region of a III-nitride device according to the first embodiment of the present invention.
Figure 9A:
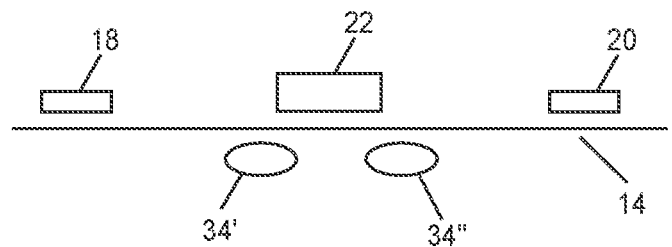
FIGS. 9A-9C illustrates various embodiments of the present invention.
Figure 9B:
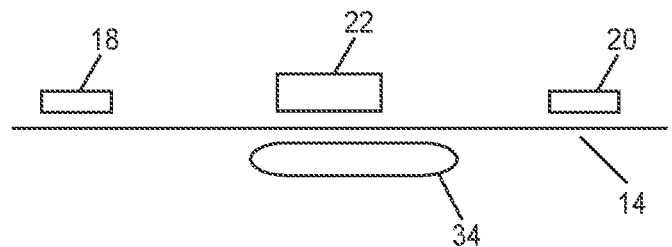
Figure 9C:
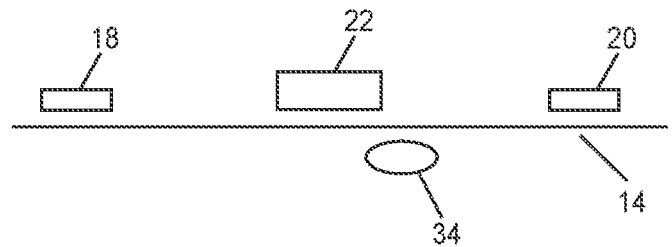

Referring to FIG. 5 in which like numerals identify like features, in a device according to the present invention 2-DEG 16 includes a reduced charge region 34 which resides under gate arrangement 22. Reduced charge region 34 is preferably twice as wide as gate arrangement 22, may extend beyond at least one edge of gate arrangement 22, and is less conductive than adjacent regions of 2-DEG 16 when the 2-DEG is in the conductive state. That is, in the on state (when there is conduction between the power electrodes 18, 29), region 34 include fewer carriers than regions of 2-DEG 16 adjacent each side thereof. As a result, the electric fields near the edges of gate arrangement 22 during the off state of the device are weaker compared to the prior art, which may allow for the omission of the field plate. Note that reduced charge region 34 does not need to be positioned symmetrically relative to first (source) and second (drain) power electrodes 18, 20 or with respect to gate arrangement 22. Thus, reduced charge region 34 may be discontinuous and arranged in two portions 34' 34" each at one side of gate arrangement 22 (FIG. 9A), may extend farther in the direction of the drain electrode (FIG. 9B), or may only extend in direction of the drain electrode (FIG. 9C) and include no portion extending beyond gate arrangement 22 toward the source electrode. The width of region 34 can be optimized and is expected to be between few tens to a few thousands of nanometers.

In a device, according to the embodiment shown by FIG. 5, gate arrangement 22 includes a schottky body 36, which is schottky coupled to second III-nitride body 14. Schottky body 36 may be any suitable schottky metal, for example, a nickel/gold stack, wherein the gold is atop the nickel.

Figure 6:
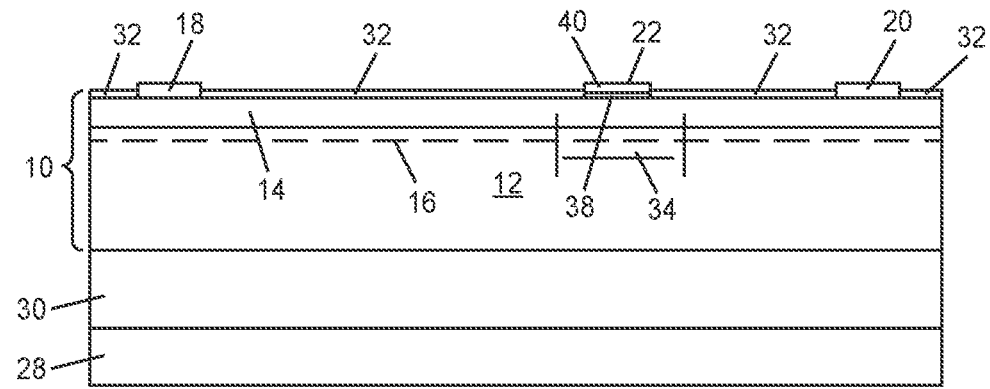
FIG. 6 illustrates a cross-sectional portion of the active region of a III-nitride device according to the second embodiment of the present invention.

Referring to FIG. 6, in which like numerals identify like features, in an alternative embodiment, gate arrangement 22 includes gate insulation body 38 on second III-nitride body 14, and gate electrode 40, which is capacitively coupled to 2-DEG 16 (and particularly to reduced charge region 34) through insulation 38. Gate insulation body 38 may be composed of silicon nitride, silicon dioxide, or any suitable gate insulation, while gate electrode 40 may be composed of any metallic or non-metallic conductive material. Examples of suitable materials for gate electrode 40 are nickel, titanium tungsten, titanium nitride, and polysilicon.

To obtain reduced charge region 34 in the embodiments according to FIGS. 5 and 6, negative charge may be introduced into second III-nitride body 14 to repel negative carriers (electrons) in the region 34 below gate arrangement 22. The negative charge may be introduced by implantation of negatively charged ions or by plasma surface treatment.

Figure 7:
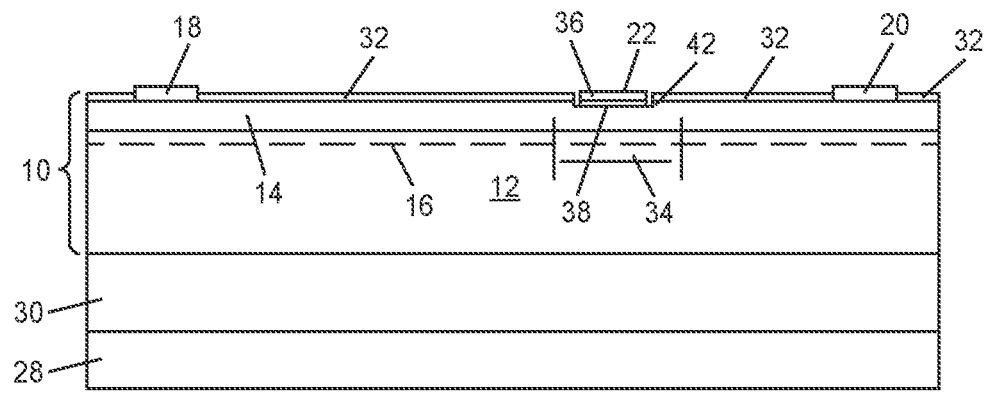
FIG. 7 illustrates a cross-sectional portion of the active region of a III-nitride device according to the third embodiment of the present invention.
Figure 8:
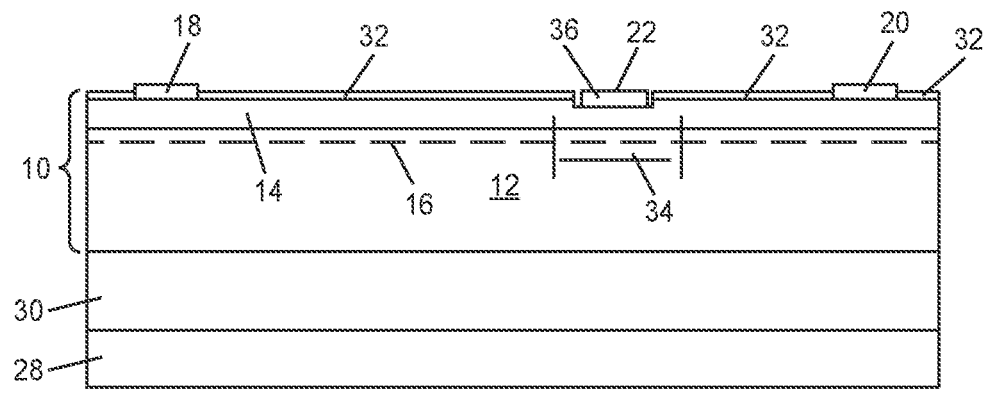
FIG. 8 illustrates a cross-sectional portion of the active region of a III-nitride device according to the fourth embodiment of the present invention.

Referring now to FIGS. 7 and 8, in which like numerals identify like features, to form reduced charge region 34 according to an alternative embodiment, recess 42 may be formed in second III-nitride body 14 in which gate arrangement 22 is received.

The depth and the width of recess 42 can be configured to partially relieve the stress in second III-nitride body 14 so that a reduced charge region 34 according to the present invention can be obtained. Note that recess 42 can be as wide as gate arrangement 22, but may be wider (as schematically illustrated) without deviating from the scope and the spirit of the present invention.

Note that although the provision of a reduced charge region 34 according to the present invention may allow for the omission of a field plate, a field plate may be added to further enhance the breakdown capability of a device according to the present invention without deviating from the scope and spirit of the invention.

Other methods for obtaining a reduced charge region 34 are surface plasma treatment, surface chemical treatment, and deposition of a suitable thin film.

In a device according to the preferred embodiment, first and second power electrodes 18, 20 may be composed of Ti, Al, Ni, Au, or any other suitable metallic or non-metallic conductive material, first III-nitride body 12 may be composed of GaN, second III-nitride body 14, may be composed of MN, transition layer 30 may be composed of a III-nitride material such as AlGaN, and substrate 28 may be composed of silicon. Other suitable substrate materials are silicon Carbide, or sapphire, or a material native to the III-nitride system, such as a GaN substrate.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:
1. A power semiconductor device, comprising:
 a III-nitride heterojunction body that includes a first III-nitride body and a second III-nitride body having a different band gap than that of said first III-nitride body;
 a first power electrode comprising a conductive material coupled to said second III-nitride body;
 a second power electrode comprising said conductive material coupled to said second III-nitride body;
 a gate arrangement including a gate electrode disposed between said first and said second power electrodes;
 a conductive channel that includes a two-dimensional electron gas (2DEG) that in a conductive state includes a reduced charge region produced by an implanted region in said second III-nitride body under said gate electrode, wherein said reduced charge region is less conductive than regions of said 2DEG adjacent each side of said reduced charge region;
 said implanted region having implanted charge in said second III-nitride body, said implanted charge configured to repel electrons in said 2DEG under and beyond edges of said gate electrode;
 said reduced charge region extending beyond at least one of said edges of said gate electrode and comprising negative charge which repels negative carriers in a region below said gate arrangement, said conductive channel being devoid of said negative charge in said regions of said 2DEG adjacent each side of said reduced charge region.
2. The power semiconductor device of claim 1, wherein said gate arrangement includes a gate insulation body.

3. The power semiconductor device of claim 1, wherein said gate arrangement includes a schottky body.

4. The power semiconductor device of claim 1, wherein said gate arrangement is received in a recess over said reduced charge region.

5. The power semiconductor device of claim 4, wherein said recess is wider than said gate arrangement.

6. The power semiconductor device of claim 1, further comprising at least one implanted region in said second III-nitride body under said gate arrangement configured to produce said reduced charge region.

7. The power semiconductor device of claim 1, wherein said gate arrangement does not include a field plate.

8. The power semiconductor device of claim 1, further comprising a passivation body disposed over said III-nitride heterojunction body.

9. The power semiconductor device of claim 1, wherein said first III-nitride body comprises a semiconductor alloy from the InAlGaN system.

10. The power semiconductor device of claim 9, wherein said second III-nitride body comprises another semiconductor alloy from the InAlGaN system.

11. The power semiconductor device of claim 1, wherein said first III-nitride body comprises GaN and said second III-nitride body comprises AlGaN.

12. The power semiconductor device of claim 1, wherein said heterojunction body is disposed over a substrate.

13. The power semiconductor device of claim 12, wherein said substrate comprises silicon.

14. The power semiconductor device of claim 12, wherein said substrate comprises silicon carbide.

15. The power semiconductor device of claim 12, wherein said substrate comprises sapphire.

16. The power semiconductor device of claim 12, wherein said substrate comprises a III-nitride material.

17. The power semiconductor device of claim 16, wherein said III-nitride material is GaN.

18. The power semiconductor device of claim 12, further comprising a transition body disposed between said substrate and said III-nitride heterojunction body.

19. The power semiconductor device of claim 18, wherein said transition body comprises a III-nitride material.

20. The power semiconductor device of claim 1, wherein said negative charge in said reduced charge region is formed by implanted negatively charged ions.

21. The power semiconductor device of claim 1, wherein said negative charge in said reduced charge region comprises a plasma treated region of said second III-nitride body.

22. The power semiconductor device of claim 1, wherein said first power electrode is a source electrode, wherein said second power electrode is a drain electrode, wherein a portion of said reduced charge region extends beyond said gate arrangement toward said drain electrode, and wherein no portion of said reduced charge region extends beyond said gate arrangement toward said source electrode.

23. The power semiconductor device of claim 22, wherein said reduced charge region terminates under said gate electrode before reaching a side of said gate arrangement facing said source electrode.

* * * * *

UNITED STATES PATENT AND TRADEMARK OFFICE
CERTIFICATE OF CORRECTION

PATENT NO. : 10,340,333 B2  
APPLICATION NO. : 15/191863  
DATED : July 2, 2019  
INVENTOR(S) : T. Herman Page 1 of 1

It is certified that error appears in the above-identified patent and that said Letters Patent is hereby corrected as shown below:

On the Title Page

Item (73) Assignee, please change "Tecimologies" to -- Technologies --.

Signed and Sealed this  
Twenty-ninth Day of October, 2019

Andrei Iancu  
*Director of the United States Patent and Trademark Office*